United States Patent [19]

Ikekame et al.

[11] Patent Number: 4,494,173
[45] Date of Patent: Jan. 15, 1985

[54] THREE-DIMENSIONAL INSULATING STRUCTURE FOR HIGH VOLTAGE COMPONENTS

[75] Inventors: Hiroo Ikekame; Yasuo Karasawa, both of Tokyo, Japan

[73] Assignee: Tokyo Shibaura Denki Kabushiki Kaisha, Kawasaki, Japan

[21] Appl. No.: 418,607

[22] Filed: Sep. 16, 1982

[30] Foreign Application Priority Data

Sep. 26, 1981 [JP] Japan .............................. 56-151368

[51] Int. Cl.³ .............................................. H02B 1/04
[52] U.S. Cl. .................... 361/429; 174/148; 363/144; 361/332; 361/420
[58] Field of Search ............ 357/76, 80, 81; 363/68, 363/141, 144; 174/148; 361/331–333, 380–388, 393, 394, 396, 417, 420, 429

[56] References Cited

U.S. PATENT DOCUMENTS

| | | | | |
|---|---|---|---|---|
| 2,295,377 | 9/1942 | Arters | ................................. | 174/148 |
| 2,949,271 | 8/1960 | Kraus, Jr. | ............................ | 174/148 |
| 3,523,214 | 8/1970 | Beniaminson | ....................... | 361/429 |
| 3,812,404 | 3/1974 | Barkan | ............................... | 363/141 |
| 3,913,003 | 10/1975 | Felkel | ................................. | 361/331 |

Primary Examiner—G. P. Tolin
Attorney, Agent, or Firm—Oblon, Fisher, Spivak, McClelland & Maier

[57] ABSTRACT

A high voltage apparatus having the three-dimensional structure of the invention has a plurality of electric units and a frame with a plurality of insulating columns. The electric units are vertically mounted in a plurality of stages between the insulating columns. Each insulating column has a plurality of insulators of a synthetic resin which are in a substantially linear arrangement at intervals; and a plurality of metallic spacers which are arranged at a distance between two adjacent insulators to couple them, and whereon the electric units can be mounted. The metallic spacers are electrically insulated from each other and the potential of each of the spacers is same as the potential of an electric unit to which the spacer is attached.

3 Claims, 9 Drawing Figures

F I G. 1
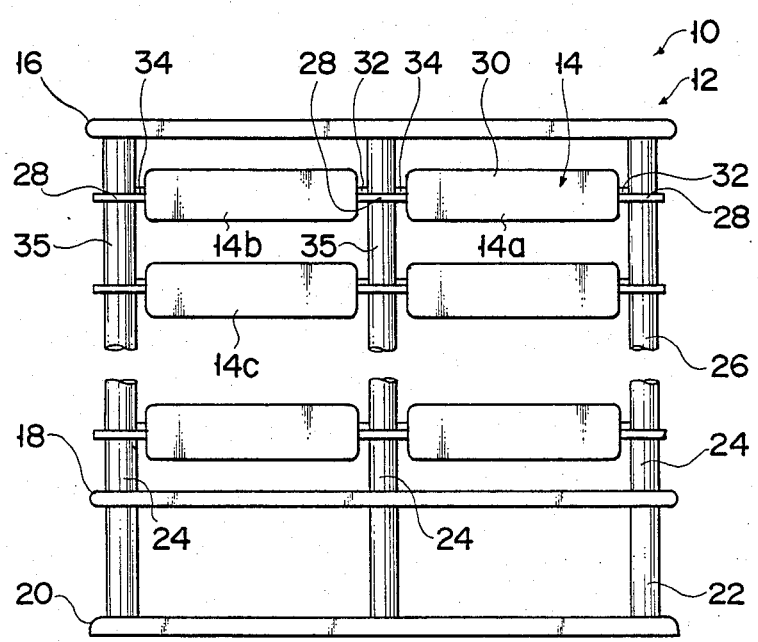

THREE-DIMENSIONAL INSULATING STRUCTURE FOR HIGH VOLTAGE COMPONENTS

BACKGROUND OF THE INVENTION

The present invention relates to a high voltage apparatus with a three-dimensional structure, comprising a plurality of electric units, and a frame having a plurality of insulating columns, the electric units being mounted in a plurality of stages between adjacent insulating columns.

High voltage apparatuses of the type described above are widely adapted for equipment to be used in electric power systems. A typical example of such a high voltage apparatus is a thyristor converter for use in high voltage direct current transmission or for use in an interlink of electric power systems of different frequencies. In a thyristor converter of this type, a number of thyristor modules are mounted in multistages between a plurality of insulating columns of a storage frame. In such a thyristor converter, the insulating columns must be able to provide excellent insulation between the electric units at different potentials and must also have sufficient mechanical strength to withstand the weight of the electric units as well as the earthquake. With recent increases in the demand for electric power, electric power systems of higher voltage and current are required and, hence, electric equipment of greater size is required. With such a trend, increases in the installation area of the equipment present a problem.

In order to solve this problem, electric equipment with tall insulating columns are required. The insulating columns used in the electric equipment must also have better insulating performance and higher mechanical strength, resulting in higher cost.

In order to clarify the problems encountered with insulating columns used in a conventional high voltage apparatus, a high voltage apparatus with conventional insulating columns will first be described with reference to FIGS. 1, 2 and 3. An example of a high voltage apparatus shown in these figures is a thyristor converter which uses, in this example, thyrisor modules as electric units or modules 14.

FIG. 1 shows a high voltage apparatus 10 with conventional insulating columns. The high voltage apparatus 10 has a storage frame 12, and a number of electric units or modules 14 of substantially identical shape mounted on the frame 12. The storage frame 12 has substantially horizontal upper and lower frames 16 and 18 with a distance therebetween, a base frame 20 placed on the floor, support insulators 22 interposed between the lower frame 18 and the base frame 20, and three insulating column 24 of an electrical insulating material which are mounted in a substantially vertical position between the upper and lower frames 16 and 18. Each insulating column 24 comprises a columnar body 26 extending between the upper and lower frames 16 and 18, and a plurality of module supports 28 which adhere to the columnar body 26 at predetermined intervals and which project therefrom. Each module 14 has a metallic casing 30, and a pair of mounting arms 32 and 34 projecting from both sides of the casing 30. Each module 14 is horizontally arranged between two adjacent insulating columns 24. The mounting arms 32 and 34 are mounted to the module supports 28 at the right and left of FIG. 1 with nuts and bolts.

In this manner, in the high voltage apparatus 10 shown in FIG. 1, the modules 14 are vertically arranged in a plurality of stages (only three are shown in the figure for the sake of simplicity), and are horizontally arranged in two rows. If the capacity of the apparatus 10 is increased, the number of stages of the vertically arranged modules 14 may be increased, and/or number of rows of the horizontally arranged modules 14 may be increased. In the latter case, the number of insulating columns 24 and the number of modules 14 which may be horizontally arranged may be increased.

FIGS. 2 and 3 show a state wherein the mounting arm 34 of a module 14a and the mounting arm 32 of a module 14b are mounted on the module supports 28 mounted on the central insulating column 24 in FIG. 1. Symbols a, b, and so on are added to reference numeral 14 for the purpose of differentiating different modules 14; reference numeral 14 will be used to generally refer to the modules. As shown in FIGS. 2 and 3, the module support 28 is a square plate with a central hole. The mounting arms 32 and 34 are of a rectangular shape and are fixed to the module supports 28 at the two sides of the columnar body 26 by means of nuts 38 and bolts 36.

Although the conventional high voltage apparatus 10 as described above is widely adopted, there is still room for improvement. First, two vertically arranged modules 14b and 14c shown in FIG. 1 must have a relatively large distance therebetween. Insulation between the modules 14b and 14c at different potentials is achieved through portions 35 of columnar bodies 26b and 26c between the module supports 28. Unlike general insulators, the columnar bodies 26 can not have ribs therearound for increasing the creeping distance. Thus, the length of the portion 35 must be prolonged, requiring a long distance for insulating between the vertically arranged modules 14b and 14c. This requirement makes the design of the apparatus difficult when it is desired to lessen the height of the high voltage apparatus or when it is desired to stack more stages of modules than is conventionally possible.

Secondly, elongate materials having high mechanical strength and insulating performance must be used in order to securely support several modules 14 by insulating columns 24, which are prepared by adhering a plurality of module supports 28 to elongate columnar bodies 26, while providing sufficient insulation between the horizontally arranged modules at different potentials. Such materials are hard to obtain, resulting in increased cost of the apparatus. This has become a big problem in the manufacture of high voltage apparatuses of large capacity and of multistage type.

Even if expensive materials as described above are used, the overall insulating column 24 is subject to the problem of poor reliability of mechanical strength since the columnar body 26 and the module support 28 are joined, for the sake of insulation, with an adhesive. An adhesive is conventionally used to join the columnar body 26 to the module support 28 since metallic bolts or the like lead to a difficult problem of insulation between the modules 14a and 14b supported by the module supports 28.

In summary, a high voltage apparatus with conventional insulating columns has a large height, low resistance to earthquakes (due to its large height) and lower insulating performance of the insulating columns. Therefore, a high voltage apparatus is desired which is not subject to the problems encountered with conventional insulating columns and which uses insulating columns made of an inexpensive material.

SUMMARY OF THE INVENTION

It is, therefore, an object of the present invention to provide a high voltage apparatus which does not have the drawbacks of conventional high voltage apparatuses, is compact in size, is mechanically strong, has high insulating performance, and can be manufactured at low cost.

In order to achieve the above object, an insulating column of a high voltage apparatus of the present invention comprises a plurality of insulators of a synthetic resin which are in a substantially linear arrangement at intervals, and a plurality of metallic spacers which are arranged between each pair of adjacent insulators so as to couple them and to be separate from each other and whereon electric units requiring support may be mounted.

In a high voltage apparatus of the present invention, an insulating column comprises a plurality of insulators and metallic spacers, as described above. The insulating columns of the present invention have various advantages over the conventional insulating columns. For example, the insulating columns are mechanically stronger than conventional insulating columns. Since these insulators are used, a greater creeping distance is obtained, allowing insulating columns of shorter length. Higher durability and reliability are obtained since the insulators are not adhered together. Finally, since large amounts of expensive materials of high mechanical strength and insulating performance need not be used, the manufacturing cost may be reduced to the minimum. Accordingly, a high voltage apparatus with such insulating columns is superior in mechanical strength, insulating performance and durability and is inexpensive to manufacture as compared with a conventional high voltage apparatus.

BRIEF DESCRIPTION OF THE DRAWINGS

FIG. 1 is a front view of a high voltage apparatus with conventional insulating columns;

DETAILED DESCRIPTION OF THE PREFERRED EMBODIMENTS

Figure 2:
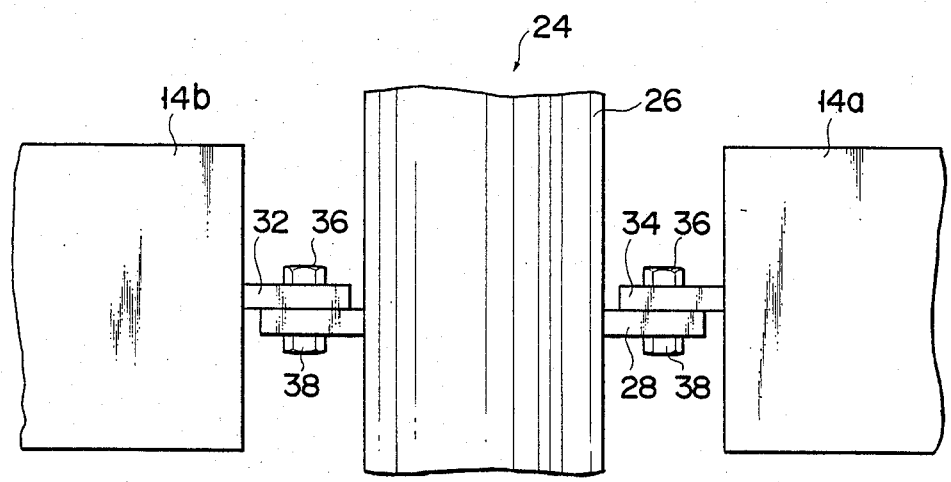
FIG. 2 is a front view showing a joined state of an insulating column and modules of the high voltage apparatus shown in FIG. 1.
Figure 3:
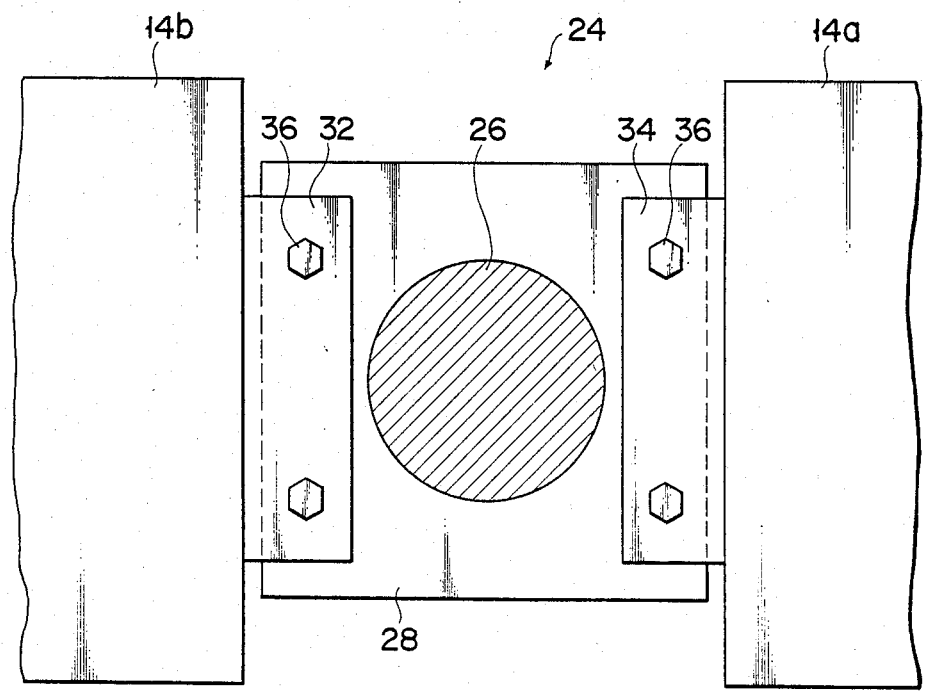
FIG. 3 is a partially sectional plan view of the joined state shown in FIG. 2.
Figure 4:
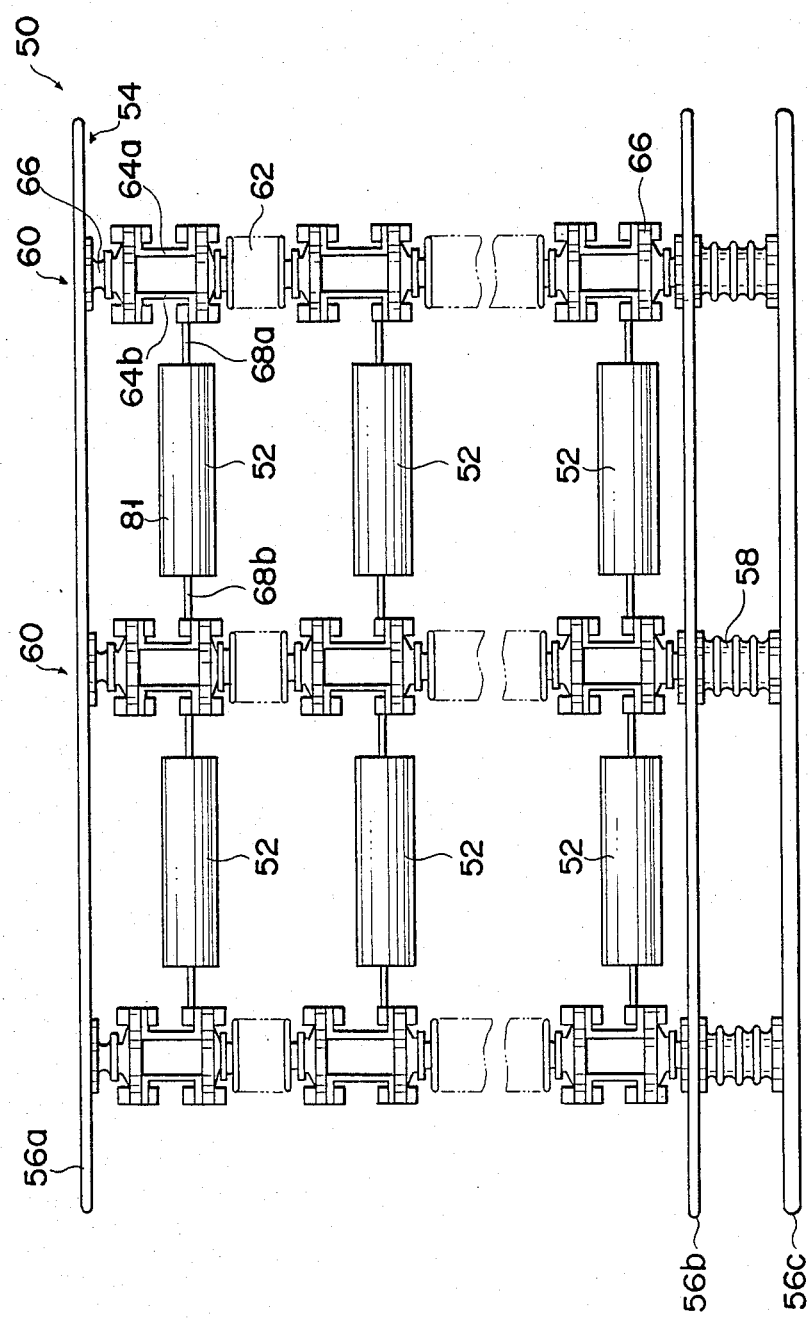
FIG. 4 is a front view of an embodiment of a thyristor converter as an example of a high voltage apparatus of the present invention.

FIG. 4 shows a thyristor converter 50 according to the present invention, which is a typical example of a high voltage apparatus with insulating columns. In the thyristor converter shown in FIG. 4, modules or thyristor modules 52 are vertically arranged in a plurality of stages (three are shown in the figure for the sake of simplicity) and horizontally arranged in two rows. A storage frame 54 for supporting the modules 52 comprises upper and lower frames 56a and 56b, a base frame 56c, support insulators 58, and three insulating columns 60. Each module 52 is supported between each pair of adjacent insulating columns 60. Each insulating column 60 comprises insulators 62 which are vertically arranged at intervals and which are made of a synthetic resin such as an epoxy resin, two metallic spacers 64a and 64b which are arranged at a distance and which couple a pair of upper and lower adjacent insulators 62, end insulators 66 mounted on the upper and lower frames 56a and 56b, and screws 98 (FIG. 6) for coupling the spacers 64a and 64b with mounting arms 68a and 68b of the modules 52.

Figure 5:
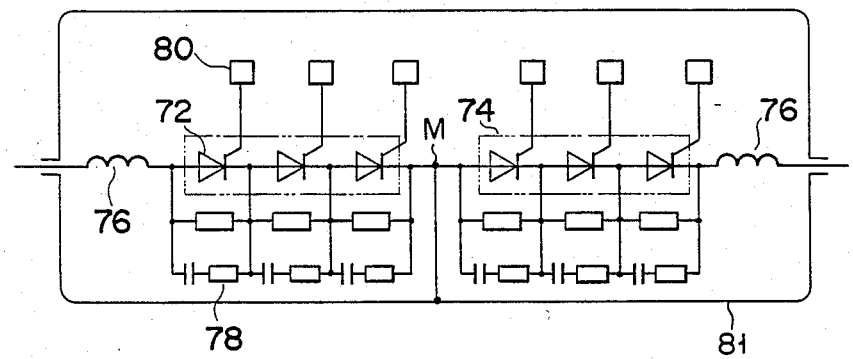
FIG. 5 is a circuit diagram of a circuit in the thyristor module used in FIG. 4.

FIG. 5 is a circuit diagram of electric components stored in the module 52. These electric components include thyristor stacks 74 each consisting of a plurality of series-parallel connected thyristor elements 72, anode reactors 76 as attachments, voltage dividing circuits 78 serving also as damping circuits, and firing circuits 80 for firing the thyristor elements 72. These electric components are housed within a single metallic casing 81 (FIG. 4). The metallic casing 81 is insulated from both the input conductor and the output conductor and is connected, as shown in FIG. 4, to the center point M of the circuit in the module 52. As the result, the potentials of the center point M and the metallic casing 81 are held at a same level and designated as a potential of the electric unit or module 52. The metallic casing 81 has the mounting arms 68a and 68b which are respectively coupled to the spacers 64b and 64a, as a result the potential of each of the spacers 64a, 64b is same as the potential of a module 52 to which the spacer is attached.

Figure 7:
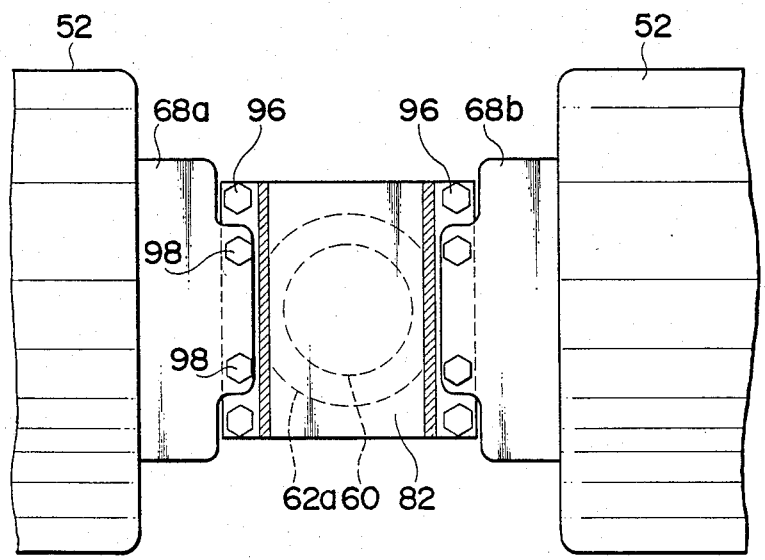
FIG. 7 is a partially sectional view of the joints between an insulating column and modules of the thyristor converter shown in FIG. 4.
Figure 6:
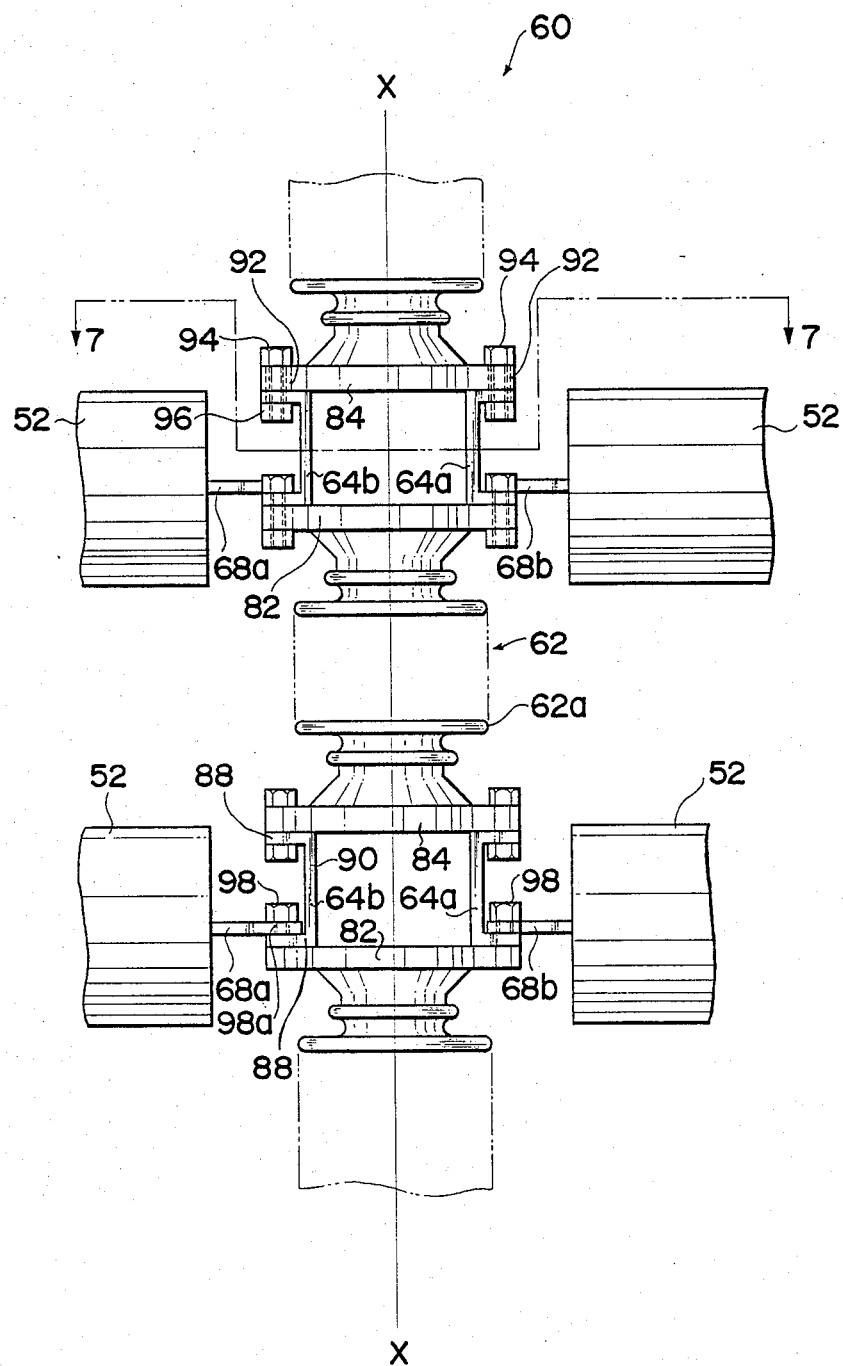
FIG. 6 is an enlarged view of the main part of the thyristor converter shown in FIG. 4.

FIG. 6 shows the joined state of the insulators 62 of the central insulating column 60 and the spacers 64a and 64b, and the joined state of the modules 52 and the spacers 64a and 64b. FIG. 7 is a sectional view along the line 7—7 of FIG. 6. Referring to FIG. 6, the insulator 62 has, at its central portion, ribs 62a for increasing the creeping distance, and, at its upper and lower ends, flanges 82 and 84 which have joining surfaces that are substantially perpendicular to the axis X—X of the insulator 62. As may be seen from FIGS. 6 and 7, the flanges 82 and 84 are of substantially square shape. The spacers 64a and 64b are of channel shape and are mounted parallel to each other, with a distance therebetween, between the flanges 84 and 82 of the upper and lower insulators 62, respectively. Each of the spacers 64a and 64b comprises two first walls 88 which are parallel to each other, and a second wall 90 perpendicular thereto. The insulator 62 and the spacers 64a and 64b are joined by inserting bolts 94 into through holes 92 formed in the two first walls 88 of each spacer 64a or 64b and in the flanges 82 and 84 respectively of the insulator and then tightening with nuts 96. The module 52 is mounted to the insulating column 60 by inserting screws 98 in screw holes 98a formed in the mounting arms 68a and 68b extending from adjacent modules 52 and in the lower first walls 88 of the spacers 64b and 64a. In order to clearly show the mounted state of the mounting arms 68a and 68b on the spacers 64b and 64a shown at the lower portion of FIG. 6, the bolts 94 and the nuts 96 which are in front of the screws 98 are omitted from the figure. A potential difference is established between the spacers 64a and 64b since the spacer 64a is at the same potential as that of the module 52 at the right and the spacer 64b is at the same potential as that of the module 52 at the left. In order to provide a good insulation between the spacers 64a and 64b, they are arranged with a distance therebetween in the manner as described above. The distance between the spacers 64a and 64b and, hence, the shape and size of the flanges 82 and 84 is suitably selected depending upon the magnitude of the potential difference.

Insulation between the two vertically adjacent modules 52 is provided by the insulators 62 each having a number of ribs, that is, a long creeping distance, in a thyristor converter manufactured according to the present invention. Therefore, the vertical distance between the modules may be made smaller than that in a conventional thyristor converter. In other words, the length of the insulating column 60 may be made shorter and the height of the thyristor converter may also be made shorter while still maintaining good insulating performance. Since the vertically adjacent insulators are coupled with metallic spacers with bolts and nuts, the mechanical strength of the overall apparatus may be improved over conventional insulating columns which include as main components columnar bodies integrally formed from an insulating material. Furthermore, the flanges for mounting the modules are integrally formed with the insulators, and need not be adhered to other insulators as in conventional columnar bodies 26 (FIG. 1). Therefore, the mechanical strength of the converter in the area of the flanges becomes extremely high, providing a highly stable module support. Since an insulating column consists of a plurality of insulators, spacers and so on, expensive elongate insulators need not be used and the manufacturing cost may be reduced as compared with that of the conventional converter.

Figure 8:
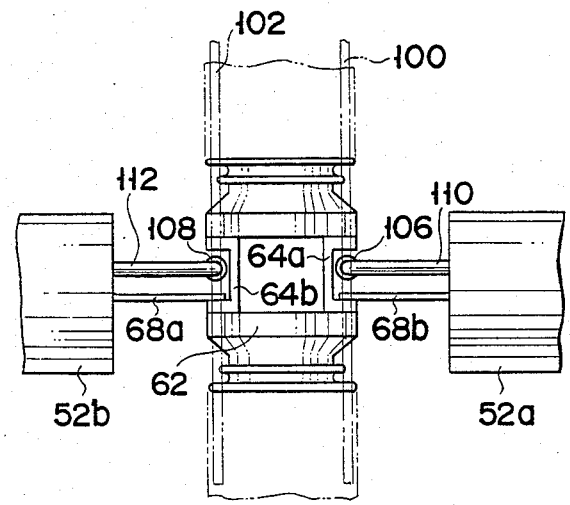
FIGS. 8 and 9 are a front view and a side view respectively of a flow path of cooling water for cooling the thyristor converter shown in FIG. 4.
Figure 9:
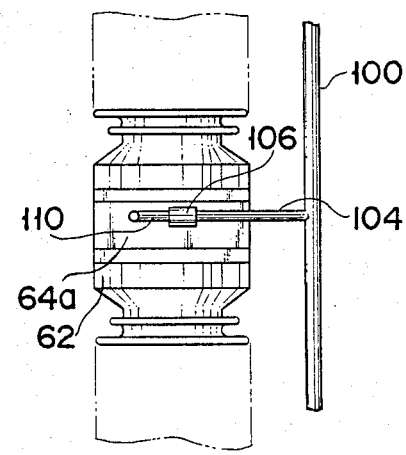

FIGS. 8 and 9 show an effective piping method for module cooling in the thyristor converter described with reference to FIG. 4. FIG. 8 shows one of the insulators for supporting the mounting arms 68b and 68a of two modules 52a and 52b shown at the right and left respectively. Piping 100 and 102 indicated by imaginary lines are arranged behind the insulators 62. FIG. 9 is a side view of the insulator 62 shown in FIG. 8 as viewed from the right side thereof. As shown in FIG. 9, a branch pipe 104 is connected to the piping 100, and a self-coupling 106 is mounted on the distal end of the branch pipe 104. Similarly, a branch pipe (not shown) is connected to the piping 102, and a self-coupling 108 is mounted on the distal end of the branch pipe 102. A pipe 110 communicating with an inner cooling path (not shown) is arranged from the module 52a shown at the right in FIG. 8, and the distal end of the pipe 110 is connected to the self-coupling 106 from the front side of FIG. 8. A similar pipe 112 communicating with an inner cooling path (not shown) is arranged from the module 52b shown at the left in FIG. 8, and the distal end of the pipe 112 is connected to the self-coupling 108 from the front side of FIG. 8. The self-couplings 106 and 108 are respectively fixed to the spacers 64a and 64b. FIGS. 8 and 9 are drawn in a simple manner except for those parts necessary for explanation of the piping for module cooling. If the piping 100 is assumed to be at the cooling water supply side, cooling water is supplied into the module 52a through the branch pipe 104, the self-coupling 106, and the pipe 110. The path leading from the piping 100 to the pipe 110 is called a supply path herein. A piping system similar to that shown in FIG. 8 is arranged also for the insulating column at the right of module 52a, and for that at the left of the module 52b. Cooling water supplied at the left end of the module 52b flows into and is exhausted by the piping 102 through the pipe 112, the self-coupling 108, and the branch pipe connecting the self-coupling 108 and the piping 102. The path leading from the pipe 112 to the piping 102 is called an exhaust path herein. The cooling water supplied from the piping 100 and passed through the module 52a is exhausted through an exhaust path similar to that shown at the left part in FIG. 8. By arranging the supply and exhaust paths in the manner as described above, the modules are cooled. Since the self-couplings 106 and 108 are arranged in the positions and orientations as described above, exchange of modules is easy in a thyristor converter of the present invention. As described above, the pipes 110 and 112 directly coupled to the modules are connected to the self-couplings 106 and 108 from the front sides of FIG. 8. Therefore, if a module 52 is detached from the spacers 64a and 64b, the module 52 may be readily taken away by pulling the pipes 110 and 112 from the self-couplings 106 and 108, and then a new module 52 may be coupled with ease to the self-couplings 106 and 108 without any objection of the other members.

What we claim is:

1. A high voltage apparatus with a three-dimensional structure comprising:

a plurality of electric units, each having a first horizontal lead and a second horizontal lead;

a frame having at least a first insulating column and a second insulating column vertically oriented and horizontally spaced from said first insulating column, said electric units being mounted in a plurality of vertical stages between said first and second insulating columns;

wherein each of said first and second insulating columns includes a plurality of insulators in a substantially vertically linear arrangement at intervals each including an upper flat flange and a lower flat flange placed substantially parallel to said upper flange, a plurality of pairs of metallic spacers, each pair of said metallic spacers being arranged between said each of said plurality of insulators to couple each of said plurality of insulators thereby to form each of said first and second insulating columns, and including a first metallic spacer and a second metallic spacer arranged at a distance from and insulated from said first metallic spacer, each of said first and second metallic spacers including an upper wall, a lower wall placed substantially parallel to said upper wall and a side wall coupling said upper and lower walls at both ends thereof, and connecting means for connecting said upper and lower walls to said lower and upper flat flanges respectively and for attaching said electric units to said lower wall of said first and second metallic spacers;

wherein each of said electric units is mounted substantially horizontally bewtween said first and second insulating columns such that said first horizontal lead of each of said electric units is mounted on each of said first metallic spacers of said first insulating column and said second horizontal lead of each of said electric unit is mounted on each of said second metallic spacers of said second insulating column.

2. An apparatus according to claim 1, wherein each insulator has a rib therearound in order to increase a creeping distance.

3. An apparatus according to claim 1 or 2, wherein said electric units include a thryristor module.

* * * * *